(12) United States Patent
Dijon et al.

(10) Patent No.: US 9,290,856 B2
(45) Date of Patent: Mar. 22, 2016

(54) SELECTIVE NANOPARTICLE DEPOSITION

(75) Inventors: Jean Dijon, Champagnier (FR); Xavier Joyeux, Bois-Colombes (FR); Jean Pinson, Fontenay-sous-Bois (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 742 days.

(21) Appl. No.: 13/508,669

(22) PCT Filed: Nov. 3, 2010

(86) PCT No.: PCT/FR2010/000731
§ 371 (c)(1),
(2), (4) Date: Nov. 29, 2012

(87) PCT Pub. No.: WO2011/058238
PCT Pub. Date: May 19, 2011

(65) Prior Publication Data
US 2013/0068625 A1   Mar. 21, 2013

(30) Foreign Application Priority Data

Nov. 10, 2009   (FR) ..................................... 09 05392

(51) Int. Cl.
| | |
|---|---|
| C25B 3/00 | (2006.01) |
| C07C 1/26 | (2006.01) |
| C07C 29/58 | (2006.01) |
| C07C 51/15 | (2006.01) |
| C07C 67/08 | (2006.01) |
| C25D 13/04 | (2006.01) |
| B82Y 30/00 | (2011.01) |
| B82Y 40/00 | (2011.01) |
| H01L 21/285 | (2006.01) |
| H01L 21/768 | (2006.01) |

(52) U.S. Cl.
CPC ................. *C25D 13/04* (2013.01); *B82Y 30/00* (2013.01); *B82Y 40/00* (2013.01); *H01L 21/28556* (2013.01); *H01L 21/76814* (2013.01); *H01L 21/76876* (2013.01); *H01L 21/76879* (2013.01); *H01L 2221/1094* (2013.01)

(58) Field of Classification Search
CPC .......... C25B 3/00; C07C 1/26; C07C 29/149; C07C 29/58; C07C 51/02; C07C 51/15; C07C 51/367; C07C 67/08; C07C 219/08; C07C 233/38; C07C 333/20; C08J 2300/12
USPC ......................................... 205/334, 355, 414
See application file for complete search history.

(56) References Cited

U.S. PATENT DOCUMENTS

| | | |
|---|---|---|
| 2007/0209943 A1 | 9/2007 | Bureau |
| 2008/0064783 A1* | 3/2008 | Chehimi et al. .............. 522/149 |
| 2008/0226895 A1 | 9/2008 | Perez et al. |

OTHER PUBLICATIONS

International Search Report and Written Opinion for Application No. PCT/FR2010/0000731 dated Feb. 11, 2011.
Cruickshank, A. C. et al., *Electrochemical Stability of Citrate-Capped Gold Nanoparticles Electrostatically Assembled on Amine-Modified Glassy Carbon*, Electrochimica Acta 54 (2009) 5566-5570.
Harnisch, J. A. et al., *Attachment of Gold Nanoparticles to Glassy Carbon Electrodes via a Mercaptobenzene Film*, J. Am. Chem. Soc. 123 (2001) 5829-5830.
Joyeux, X. et al., *Localized Attachment of Carbon Nanotubes in Microelectronic Structures*, Adv. Mater. 21 (2009) 4404-4408.
Ledain, S. et al., *An Evaluation of Electrografted Copper Seed Layers for Enhanced Metalllization of Deep TSV Structures*, Interconnect Technology Conference, IITC 2008, IEEE (2008) 159-161.
Lu, T. et al., *Choices for Future Interconnect Materials and Processing*, Solid-State and Intetrated Circuit Technology,ICSICT '06 (Oct. 2006) 287-290.
Mangiagalli, P., *A Novel Approach to TSV Metallization based on Electrografted Cooper Nucleation Layers*, Alchimer Coating Solutions, PEAKS Conference (Sep. 2007),pp. 1-26.
Poul, L. et al., *Synthesis of Inorganic Compounds (Metal, Oxide and Hydroxide) in Polyol Medium: A Versatile Route Related to the Sol-Gel Process*, Journal of Sol-Gel Science and Technology, 26, (2003) 261-265.

* cited by examiner

*Primary Examiner* — Zulmariam Mendez
(74) *Attorney, Agent, or Firm* — Alston & Bird LLP

(57) ABSTRACT

The invention relates to a method for deposition of nanoparticles made of an insulating, semi-conductive, or conductive material onto predetermined areas, made of a conductive or semi-conductive material, located on a substrate. The invention also relates to a method for manufacturing electrodes. The method of the invention includes the steps of a) creating insulating material areas I around areas Z when said areas I are not already present; b) deposition, by means of electrografting, of a polymer P prepared from a diazonium salt or vinyl monomer salt, or a mixture of the above, onto the conductive or semi-conductive material that forms the areas Z; c) coating the nanoparticles with a coating material that includes a bifunctional molecule capable of creating a bond with the nanoparticles and a bond with the polymer P; d) suspending the coated nanoparticles obtained in Step c) in a solvent, preferably a coating material solution used in Step c); e) immersing the substrate S obtained in Step b) into the suspension obtained in Step d); and f) removing the polymer P. The invention is in particular useful for manufacturing electrodes.

18 Claims, No Drawings

SELECTIVE NANOPARTICLE DEPOSITION

FIELD OF THE INVENTION

The invention relates to a process for the deposition of nanoparticles made of an insulating, semiconducting or conducting material on predetermined regions, made of a conducting or semiconducting material, of a substrate.

It also relates to a process for the manufacture of carbon nanotubes and to a process for the manufacture of electrodes.

BACKGROUND OF THE INVENTION

In a large number of applications employing carbon nanotubes, it is necessary to localize a catalyst in structures having small dimensions, such as, for example, vias, in order to produce interconnections having small diameters.

It is a matter in this case of catalyst nanoparticles, that is to say particles having their greatest dimension less than or equal to approximately 100 nm.

Furthermore, once the catalyst is localized in the hole, it is necessary for the process for growth of carbon nanotubes to be able to be applied in the hole.

Several techniques are used to date to deposit the catalyst, or any other nanoparticle, without selective localization between the upper layer and the bottom of the vias, for example.

In these cases, the nanoparticles are deposited over the entire surface and are subsequently removed by chemical mechanical polishing (CMP) or by ionic erosion of the upper layer in order to remain localized only in the bottom of vias. The deposition process must be directed in order to prevent the deposition of the nanoparticles and the growth of the carbon nanotubes on the sides of the holes.

Furthermore, one of the major difficulties is to obtain particles having small dimensions, of less than 50 nm, which are stable up to a temperature of approximately 1000° C. and in a sufficient density to obtain high densities of carbon nanotubes or (between $10^{11}$ and $10^{14}$ carbon nanotubes per $cm^2$).

Many processes for the deposition of catalyst are described in the literature which are divided into two main categories: processes for the deposition of a thin film and processes for the direct deposition of nanoparticles.

With the processes for the deposition of a thin film, the thickness of the film controls the mean size, that is to say the statistical mean of the sizes of the particles, measured by scanning or transmission of electromicroscopy and statistical calculation and the density of the particles. However, the control of the size and the density of the particles cannot be carried out independently of one another.

The deposit can be annealed in order to obtain the nanoparticles by dewetting the film. The selectivity of the deposition on the desired regions is obtained by the combination of nonconforming depositions and etching.

This category includes PVD (physical vapor deposition) deposits, the deposits obtained by the chemical route starting from a solution, by reduction of metal salts, by decomposition of a metal salt or of an iron-storage protein (ferritin). In this case, there is no selectivity of the deposition, indeed even a difficulty in depositing the catalyst at the hole bottom because of problems of diffusion of the catalyst.

The electrochemical depositions of thin films on conductors are also included in this category of processes.

In the processes for the direct depositions of nanoparticles, the nanoparticles are produced either at the time of carrying out the deposition by laser decomposition of a salt of a catalyst, for example of ironpentacarbonyl, by plasma, by use of laser ablation of a target under vacuum, or, finally, by generation of aerosol introduced directly into a laminar flow reactor, or the nanoparticles are produced with a first process and then dissolved, and the deposition takes place subsequently on the surfaces.

In this case, there is no selectivity of the deposition with respect to the structure on which it is carried out. On the other hand, it is possible to use all the resources of chemistry in order to obtain nanoparticles which are well graded in diameter and thus with very narrow size distribution (standard deviation of the order of 0.2 nm).

In point of fact, in a great number of applications, it is necessary to carry out a selective deposition of nanoparticles in devices having small dimensions.

In general, these nanoparticles are catalyst nanoparticles.

In particular, in a great number of applications employing carbon nanotubes, it is necessary to localize a catalyst in structures having small dimensions, of the order of 100 nm or less, such as, for example, vias, in order to produce interconnections having small diameters.

The growth of the carbon nanotubes takes place starting from the catalyst nanoparticles.

"Nanoparticles" is understood to mean, in the invention, particles having a very low mean diameter of less than 10 nm, preferably between 2 and 4 nm.

In the case of the growth of carbon nanotubes, it is furthermore necessary that, once the catalyst is localized in the hole, the process for the growth of the carbon nanotubes be able to be applied in the hole.

The ideal characteristics for the deposition of nanoparticles, in particular the catalysts suitable for this application, are as follows:

- particles having a very low diameter (nanoparticles),
- particles which are stable with regard to temperature (in order to avoid coalescence and sintering of the individual particles). For this, it is preferable to use particles based on metal oxides rather than metal particles or layers,
- selective deposition between the horizontal and vertical surfaces of vias,
- selective deposition between the surfaces of the top and the bottom of the substrate in which the vias occur, and
- control of the distribution of the particles (diameter $\phi$, density D and standard deviation $\sigma$).

The deposition of continuous films by PVD makes it possible to deposit particles of metal catalysts or of metal oxides with a selective deposition between the horizontal and vertical surfaces.

It also makes it possible to control the diameter of the particles.

However, it does not make possible selective deposition between the surfaces of the top and the bottom.

Neither does it make it possible to control the density of the particles and the standard deviation $\sigma$.

The deposition of continuous films of particles by electrochemical deposition makes possible the deposition of metal catalysts with selective deposition between the horizontal and vertical surfaces and also between the surfaces of the top and the bottom.

It also makes it possible to control the diameter of the particles.

However, it does not make it possible to deposit a metal oxide catalyst, which is insulating, and it does not make it possible to independently control the density of the particles, the size and the standard deviation $\sigma$.

The chemical deposition in solution of continuous films of particles makes possible the deposition of metal catalysts or of metal oxide catalysts and the control of the diameter of the particles.

However, it does not make possible a selective deposition between the horizontal and vertical surfaces and between the surfaces of the top and the bottom and does not make it possible to independently control the density of the particles, the size and the standard deviation.

The PVD deposition of nanoparticles makes possible the deposition of metal catalysts and metal oxide catalysts.

It also makes it possible to control the diameter of the particles, their densities and the standard deviation σ.

However, it does not make possible a selective deposition between the surfaces of the top and the bottom.

Thus, no current process meets all the criteria of an ideal deposition of catalyst.

SUMMARY OF THE INVENTION

The object of the invention is to provide a process for the deposition of nanoparticles, in particular of nanoparticles of catalyst, satisfying all the desired criteria.

In particular, this process makes possible the deposition of nanoparticles of insulating oxides, such as metal oxides, which makes it possible to retain the integrity of the nanoparticles at high temperature.

"Nanoparticles" is understood to mean, in the invention, particles with a very low mean diameter of less than 10 nm, preferably of between 2 and 4 nm.

This process for the deposition of nanoparticles furthermore makes it possible to bring about the growth of the carbon nanotubes in structures having small dimensions.

To this end, the invention provides a process for the deposition of nanoparticles made of a conducting or semiconducting or insulating material on predetermined regions Z made of a conducting or semiconducting material of a substrate S, characterized in that it comprises the following stages:

a) creating, around the regions Z, regions I made of an insulating material, when these regions I are not already present, b) depositing, by electrografting, on the conducting or semiconducting material constituting the regions Z, a polymer P prepared from a diazonium salt or from sulfonium salts or from iodonium salts or from ammonium salts or from alkyl halides or from vinyl monomers or from a mixture of these, c) coating the nanoparticles with a coating material comprising a bifunctional molecule capable of creating a bond with the nanoparticles and a bond with the polymer P, d) suspending the coated nanoparticles obtained in stage c) in a solvent, preferably a solution of the coating material used in stage c), e) immersing the substrate S obtained in stage b) in the suspension obtained in stage d), and f) removing the polymer P.

DETAILED DESCRIPTION OF THE INVENTION

In this process, stages a) and b) can be carried out before or after stages c) and d).

The polymer P, which is localized on the regions of interest Z, acts as "magnet" for the nanoparticles. There is no connection or chemical reaction leading to strong bonds between the polymer P and the nanoparticles; the nanoparticles are attracted to the polymer, in particular due to their coating.

When the surface of the regions Z is oxidized, it is necessary, before grafting the polymer P, that is to say before stage b), to remove this surface oxide layer.

Of course, the removal of the polymer P takes place after having withdrawn the substrate S from the suspension of nanoparticles and after having removed the solvent of the suspension.

The removal of the polymer P can be carried out by any means. Preferably, it is carried out by thermal decomposition of the polymer P.

During this removal of the polymer P, there is no release of the nanoparticles as the latter are subject to attractive forces on the part of the substrate, in particular by forces of Van der Waals type.

With regard to the nanoparticles, they are preferably chosen from nanoparticles of a metal or of a metal oxide.

More preferably, in the process of the invention, the nanoparticles are nanoparticles of nickel oxide or of iron oxide or of cobalt oxide or of the alloys or mixtures of these, such as oxides of nickel and cobalt, oxides of iron and cobalt or also oxides of iron and nickel.

When the nanoparticles are not oxidized, in particular in the case of nanoparticles of metal, the process of the invention additionally comprises a stage of partial or complete oxidation of their surface.

The nanoparticles are formed, for example, by reduction of metal salts by gentle reducing agents, such as a polyol, by hydrazine, by borohydrides, by precipitation in a basic medium, by electron beam lithography or by any other known method.

A preferred method is the method of reduction by polyol.

This method is described by Poul L. et al. in "Synthesis of Inorganic Compounds (Metal, Oxide and Hydroxide) in Polyol Medium: A Versatile Route Related to the Sol-Gel Process", Journal of Sol-Gel Science and Technology, 26, 261-265, 2003.

These nanoparticles, once completely oxidized or partially oxidized, or when nanoparticles already oxidized are concerned, are, in the process of the invention, suspended in a solvent in order to carry out the deposition on the predetermined regions Z of the substrate S.

It is therefore necessary to stabilize the nanoparticles in the solvent via a coating (capping). This coating also serves to cause the nanoparticles to be attracted by the polymer P.

This coating can be carried out with the solvent of the suspension.

However, it can also result from the addition of a coating material during the synthesis of the nanoparticles.

It can also be carried out after the synthesis of the nanoparticles.

Preferably, the nanoparticles are coated in the solvent used for their suspending. In this case, in the process of the invention, the coating stage c) and the suspending stage d) will be simultaneous.

However, the coating, once again, can be carried out after the synthesis of the nanoparticles, before they are suspended in a solvent, which will then be different from the coating material.

In all cases, the coating material is preferably chosen from poly(hydroxymethyl methacrylate), diethylene glycol and cetyltrimethylammonium bromide.

The substrate S can be entirely made of a conducting or semiconducting material, in which case it is necessary to create, around the regions Z on which it is desired to deposit the nanoparticles, regions I made of an insulating material.

However, the substrate can also already naturally comprise regions Z made of a conducting or semiconducting material and regions made of an insulating material, in which case it is not necessary to create regions I, the latter already existing.

The conducting or semiconducting material is more particularly, in the invention, a material chosen from carbon, doped or undoped silicon, a silicide or a metal.

Nickel or iron or cobalt silicide can be used.

A preferred metal is aluminum or titanium.

The conducting or semiconducting material can also be titanium nitride (TiN) or tantalum nitride (TaN).

The regions I made of an insulating material are preferably made of a material chosen from silica ($SiO_2$), alumina ($Al_2O_3$) and a phosphosilicate glass (PSG).

The regions I made of an insulating material have to have the minimum of possible interactions with the material for coating the nanoparticles.

Thus, when the regions I are made of silica, which is hydrophilic, and when the coating material has a hydrophilic functional group directed towards the outside of the nanoparticle, it is necessary to transform the surface of the silica, to which OH groups are bonded, into a surface of the hydrophobic SiH type or a silanized surface, for example obtained by treatment of this surface with a silane which reacts with the OH groups of the surface and which has hydrophobic groups outside the layer.

Moreover, the layer of oxide possibly formed at the surface of the regions Z made of a conducting or semiconducting material of the substrate S has to be removed in order to ensure good conduction.

In the case of a semiconducting material, such as silicon, doped silicon or a silicide, this stage of removal of the surface oxide layer can be carried out with a solution of hydrofluoric acid: for example, the substrate S is immersed in a 0.2% by volume solution of hydrofluoric acid in water for 2 minutes under ultrasound.

The sample is subsequently rinsed with distilled water and dried with argon.

In the case of the regions Z made of a conducting material, such as titanium or titanium nitride, the stage of removal of the surface oxide layer is carried out in a solution of sulfuric acid: for example, the substrate S is immersed in a 10% by volume solution of sulfuric acid in water for 5 minutes. The sample is subsequently rinsed with distilled water and dried with argon.

Of course, the removal of the surface oxide layer from the conducting or semiconducting material can be carried out by other methods, as will be clearly apparent to a person skilled in the art.

However, the core of the invention lies in the stage of deposition, on the regions Z, of a layer of a polymer P which acts as impregnation layer which makes it possible to capture the suspended nanoparticles.

The deposition of this impregnation layer, that is to say of the layer of the polymer P, is carried out, in the process of the invention, by electrochemistry, more specifically by electrografting, on the regions Z, which provides for the selectivity of this deposition on the conducting regions.

Thus, it is seen that, by virtue of the process of the invention, the flexibility of the chemistry to produce and select the diameter and the standard deviation of the distribution of the particles to be deposited is combined with the selectivity of the electrochemistry to form layers of polymers localized on the regions Z.

Furthermore, as the deposition of the nanoparticles does not take place by electrochemistry, the deposition of insulating particles, such as metal oxides, is possible, which is a great advantage in maintaining the individuality of each nanoparticle, up to the temperature of growth of the carbon nanotubes, when it is desired subsequently to bring about the growth of the carbon nanotubes.

This polymer P must thus be capable of being electrografted to the conducting or semiconducting material constituting the regions Z. Polymers suitable for this purpose are the polymers prepared from a diazonium salt or from vinyl monomers or from a mixture of these.

It can thus be a polymer P which comprises ammonium, amine, alcohol, carboxylate, carboxyl, halide or thiol functional groups and the mixtures of these.

Electrografting is understood to mean, in the invention, all of the methods which make it possible to establish sufficiently strong bonds between a metal, a semiconducting material, carbon or even an oxidized surface, and a polymer, by electron transfer, for example via an electrochemical reaction.

These methods can be classified into two categories, methods by oxidation and methods by reduction.

The methods by oxidation proceed by the oxidation of amine, alcohol, carboxylate or Grignard reagents (organomagnesium) functional groups.

The methods by reduction use the reduction of aryl-diazonium salts, of vinyl compounds, of mixtures of compounds comprising diazonium and vinyl functional groups and also alkyl halides, ammonium, sulfonium or iodonium salts, and the like.

When the polymer P is prepared from a diazonium salt, it then comprises repeat units of aryl type having the following formula:

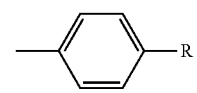

in which R is a $C_1$ to $C_{14}$ alkyl, or an alkyl chain partially or completely substituted by halogens, CN, OH, $NH_2$, $NO_2$ or COOH, or a $C_6$ aryl or a fused $C_{10}$ aryl, such as naphthalene, or a fused $C_{14}$ aryl, such as anthracene, or CN, OH, $NH_2$, $NO_2$ or COOH, or also a protein.

The electrical neutrality is provided by an anion, for example a halogen ($X^-$) or a fluoroborate $BF_4^-$.

The reaction which takes place is as follows:

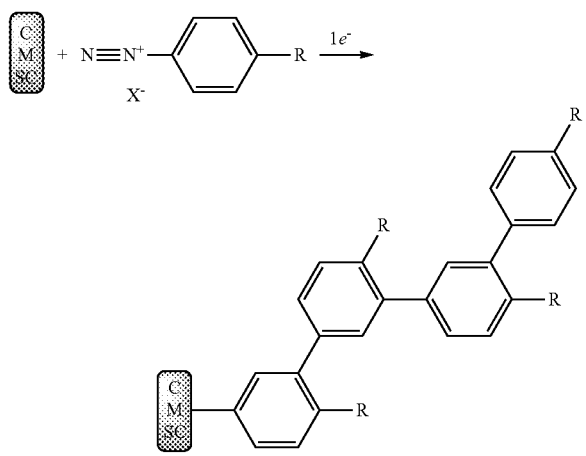

When the polymer P is prepared from vinyl monomers, it then comprises units having the following formula:

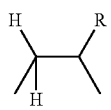

in which R is a $C_1$ to $C_{14}$ alkyl, or an alkyl chain partially or completely substituted by halogens, CN, OH, $NH_2$, $NO_2$ or COOH, or a $C_6$ aryl or a fused $C_{10}$ aryl, such as naphthalene, or a fused $C_{14}$ aryl, such as anthracene, or CN, OH, $NH_2$, $NO_2$ or COOH, or also a protein.

In this case, the polymer P is a poly(acrylonitrile)polymer, or a poly(butenenitrile)polymer, or a poly(methacrylonitrile) polymer or a poly(methacrylate)polymer, or a poly(hydroxyethyl methacrylate)polymer, or a poly(hydroxymethyl methacrylate)polymer, or a polystyrene, preferably.

In this case, the electrografting of the polymer P to the conducting surface takes place in the following way on the regions Z of the substrate:

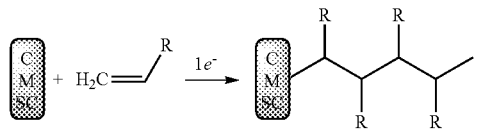

When the polymer P is obtained from a diazonium salt and from vinyl monomers, the electrografting reaction of these polymers to the regions Z of the substrate S takes place according to the following scheme in protic or aprotic solvents:

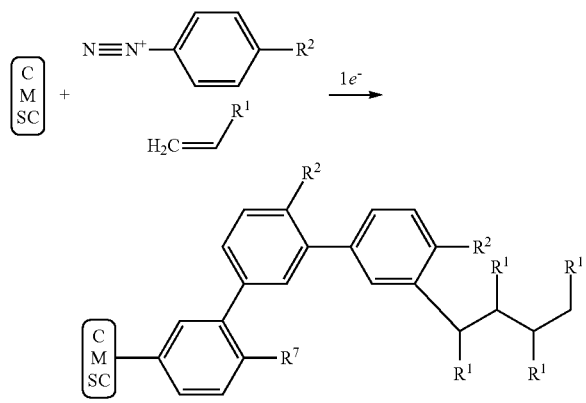

In the preceding schemes, C denotes carbon, M denotes a metal and SC denotes a semiconducting material and represents the materials of which the regions Z are composed and $R_1$ and $R_2$ are identical or different and have individually the same meanings as defined beforehand for the R group.

A preferred polymer P is a poly(4-carboxyphenylene) obtained from the corresponding diazonium salt (4-carboxybenzenediazonium).

Preferably, in the process of the invention, the regions Z of the substrate S are the bottoms of electrode vias.

Once the substrate S has been prepared in the preceding way, that is to say to which the polymer P has been grafted on the regions Z, it is immersed in the suspension of nanoparticles for a predetermined time and at a controlled bath temperature. This time and this temperature will easily be determined by a person skilled in the art by simple experiments.

The time and the temperature make it possible to control the density of nanoparticles deposited on the regions Z made of conducting or semiconducting material.

It is the combination of the physical or chemical interactions between the coating of the nanoparticles and the electrografting of the polymer P, at the same time as the absence, as much as possible, of interactions between the coating of the nanoparticles and the regions I made of an insulating material, which provides the selectivity of the deposition.

This selectivity can be of thermodynamic type, that is to say that the interactions between the coating of nanoparticles and the electrografted polymer P can be greater ($\Delta G<0$) than between the coating of the nanoparticle and the regions I made of an insulating material.

However, it can also be of kinetic type, that is to say that the interaction between the coating of the nanoparticle and the electrografted polymer P will be established faster than with the regions I made of an insulating material.

A person skilled in the art will determine by variable time tests at what moment to halt the deposition.

The invention also provides a process for the manufacture of carbon nanotubes.

This is because, once the nanoparticles have been deposited on predetermined regions Z of the substrate, these regions Z preferably being the bottoms of electrode vias, and after removal of the polymer P, the nanotubes can be grown on the deposited nanoparticles, for example in the vapor phase.

In this case, the growing process comprises a stage of oxidation of the nanoparticles. To this end, a stage of bringing the substrate to the correct temperature under an oxygen atmosphere is carried out, in contrast to what is conventionally done.

To this end, generally, the first stage of the growth of carbon nanotubes is a stage of reduction of the catalyst nanoparticles.

In the process for the manufacture of carbon nanotubes of the invention, the oxidation stage makes it possible to avoid, in particular, the coalescence of the nanoparticles during the rise in temperature of the device for growing the nanotubes. This oxidation stage is a stage of partial oxidation (at the surface) of the nanoparticles or of complete oxidation (to the core) of the nanoparticle.

Thus, the substrate S obtained by the process of the invention is placed in a heating chamber under a partial oxygen or air pressure of 0.3 mbar up to a temperature of 600° C.

Then, a reactive mixture composed of 50 sccm of helium, 50 sccm of hydrogen and 10 sccm of acetylene is then introduced into the chamber, under a pressure of 1 torr.

Growth is then allowed to take place, until the desired size (length) of the nanotubes of between 1 and 100 µm, inclusive, is obtained, generally for 5 to 10 min.

The heating chamber is subsequently cooled under a stream of helium.

However, the process for the deposition of nanoparticles of the invention can also be used to deposit magnetic nanoparticles on two-dimensional structures.

These nanoparticles are in particular made of a para-magnetic iron oxide.

The process for the deposition of nanoparticles of the invention can also be used to deposit silica particles in photoluminescence.

In the deposition process of the invention, the coating of the nanoparticles has to, be complete, so that the oxidized surface of the nanoparticle is not capable of an interaction either with the regions Z of the substrate on which the polymer P is electrografted or with the regions I.

These are the interactions between the coating material of the nanoparticle and the electrografted polymer P which ensure the specificity of the deposition of the nanoparticles on the conducting or semiconducting regions Z of the substrate.

These interactions can be of three types:
Van der Waals forces,
hydrogen bonds,
electrostatic interactions.

Moreover, the interactions between the coating material of the nanoparticles and the regions I made of insulating material of the substrate have to be as weak as possible; generally, the insulating material is composed of hydrophilic silica $SiO_2$, carrying OH groups.

However, as has already been said, it is possible, by treatments with HF or $NH_4F$, well known in the micro-electronics industry, to transform the surface of the silica into a hydrophobic hydrogenated surface SiH.

With the process of the invention, it is thus possible, which is important, to adjust both the reactivity of the layer of electrografted polymer P and regions I made of an insulating material with the coating material of the nanoparticles.

The invention also provides a process for the manufacture of a fuel cell electrode which comprises a stage of manufacture of nanoparticles according to the process of the invention.

In the case where it is desired to obtain the growth of carbon nanotubes in this electrode, the invention finally provides a process for the manufacture of an electrode which comprises a stage of manufacture of carbon nanotubes according to the invention, that is to say comprising a stage of deposition of nanoparticles in vias of the electrode, according to the process of the invention, and a stage of growth of the carbon nanotubes in the vapor phase starting from these nanoparticles, which, in this case, are catalyst nanoparticles.

In order to achieve a better understanding of the invention, several implementational examples thereof will now be described.

These examples are given purely by way of illustration and without implied limitation.

EXAMPLE 1

Interactions with Hydrogen Bonds

Iron Oxide Nanoparticles are Coated with Diethylene Glycol (DEG)/Electrografted Layer of Polyhydroxyethyl Methacrylate (p-HEMA)

In this example, use is made of a silicon substrate covered with silica in which vias have been etched down to the silicon.

The bottom of the vias is composed of silicon, titanium or aluminum.

The nanoparticles are prepared by the polyol method described by Poul L. et al., "Synthesis of Inorganic Compounds (Metal, Oxide and Hydroxide) in Polyol Medium: A Versatile Route Related to the Sol-Gel Process", Journal of Sol-Gel Science and Technology, 26, 261-265, 2003.

Preparation of the Nanoparticles Coated with DEG

An appropriate amount of iron(II) acetate is added to a given volume (125 ml) of DEG until a nominal concentration of iron cations of 0.2M is reached. Deionized water is added until a hydrolysis ratio, defined by the water/iron molar ratio, of ~11 is reached. The mixture is then heated to boiling point at a rate of 6° $C.min^{-1}$ with stirring and is maintained at this temperature for 2 hours. The brown powder obtained is washed several times with ethanol and then acetone under ultrasound with intermittent centrifuging and dried in air at 50° C.

Preparation of the Substrate

The first stage of the preparation of the substrate with the electrografting is the cleaning.

When the bottom of the vias is made of silicon, it consists in removing the layer of native oxide $SiO_2$ on the silicon at the bottom of the vias and in transforming the $SiO_2$ surface into SiH. This stage has to be carried out without damaging the structure made of $SiO_2$. A dilute (0.2%) solution of hydrofluoric acid (HF) is used for this. More specifically, the substrate is immersed in the HF solution for 2 minutes under ultrasound. The use of sonication is justified by the replacement of the HF molecules on the surface of the silicon at the bottom of the vias. The very short cleaning time makes it possible not to damage the walls of the vias made of $SiO_2$. The substrate is subsequently copiously rinsed with deionized water and is used rapidly for electrografting.

The same procedure is used for vias having a bottom composed of titanium, in order to remove the layer of titanium oxide formed on the titanium.

Preparation of a Layer of p-HEMA on the Silicon, Titanium or Aluminum

The standard experimental protocol used is described in patent application US 2007/0209943.

In practice, $20 \times 10^{-3}$ mol of monomer (HEMA) are dissolved in 50 ml of 1.2M HCl and then the solution is poured into an electrochemical cell and degassed with argon. After half an hour, $5 \times 10^{-4}$ mol of diazonium are dispersed in the solution. The substrate is then connected at the front face via a contact to the silver adhesive and placed in the cell opposite a contraelectrode made of carbon sheet. A reference saturated calomel electrode (SCE) is added. The potential is applied between the equilibrium potential of the solution on open circuit and −2 V/SCE. Eight scans are carried out in order to obtain a polymer layer thickness of approximately 15 nm. The sample is subsequently rinsed, using a wash bottle, with dimethylformamide (DMF), in order to remove the traces of ungrafted polymer, with acetone, in order to remove the DMF, and finally with water, in order to remove any traces of organic components. After drying with argon, the sample is ready for the deposition of nanoparticles.

Deposition of the Coated Nanoparticles on the Electrografted Polymer 0.4 mg of nanoparticles are suspended in 5 ml of DEG, which represents 0.08 g/l of suspended nanoparticles. After sonication for one hour at 50° C., the suspensions of nanoparticles were centrifuged at 10000 rpm for 10 min and only the supernatant of these suspensions was deposited on substrates including the vias comprising an Si molten electrografted with the p-HEMA polymer for 15 minutes. The increase in the temperature makes it possible to render the solvent less viscous and thus to facilitate the movement of the particles down to the bottom of the vias. DEG has a viscosity of 30 200 cP at 25° C. This falls to 2505 at 100° C.

The mobility of the nanoparticles in solution is thus found to be improved. Furthermore, the glass transition temperature ($T_g$) of the p-HEMA is 87° C.; consequently, the polymer chains can move more easily at a temperature greater than $T_g$. A rise in temperature thus promotes the adsorption of nanoparticles on the polymer.

By this process, a density of well dispersed nanoparticles of ~$10^{12}$ nanoparticles/cm$^2$ is obtained.

Annealing

The polymer which makes possible the adsorption of the nanoparticles has to be destroyed by annealing before proceeding to the growth of the carbon nanotubes (CNTs). Samples comprising nanoparticles in their via bottoms were subjected to an annealing under air at 450° C. (or greater than the decomposition temperature of the polymer).

In this example, the desired selectivity of the grafting to the regions Z is provided by the similarity between the structures of DEG: HO—CH$_2$—CH$_2$—O—CH$_2$—CH$_2$—OH and p-HEMA: {—CH$_2$—CH—(CH$_3$) [C(=O)—O—CH$_2$—CH$_2$OH]—}$_n$.

It is the Van der Waals forces between the CH$_2$ groups and above all the hydrogen bonds between the OH groups which provide the bulk of the selectivity; the other part of the selectivity is obtained by the low affinity between the SiO$_2$ surface treated with HF and the DEG. The best evidence is as follows: when the diethylene glycol dimethyl ether CH$_3$O—CH$_2$—CH$_2$—O—CH$_2$—CH$_2$—OCH$_3$, where the OH groups are methylated, is used, the hydrogen bonds are no longer possible and the nanoparticles are dispersed over the whole of the structure.

EXAMPLE 2

Interactions Via Hydrogen Bonds

Iron and Cobalt Oxide Nanoparticles Coated with Diethylene Glycol (DEG)/Electrografted Layer of Polyhydroxyethyl Methacrylate(p-HEMA)

In this example, use is made of the same substrate as in example 1 and iron and cobalt nanoparticles CoFe$_2$O$_4$ synthesized in diethylene glycol.

Preparation of the Nanoparticles Coated with DEG

The precursor salts, FeCl$_3$ and Co(CH$_3$COOH)$_2$.4H$_2$O, are added in a stoichiometric proportion (2:1) to a given volume of 1,2-propanediol (250 ml).

The total concentration of metal is 0.3 mol·l$^{-1}$. The addition of water and sodium acetate makes it possible to exert better control over the size of the nanoparticles. In order to obtain nanoparticles having a mean diameter of 5.5 nm, it is necessary to have $n_{water}/n_{metal}$ and $n_{NaCOO}/n_{metal}$ ratios of 9 and 3 respectively. Thus, 8.11 g of FeCl$_3$, 6.23 g of Co(CH$_3$COOH)$_2$.4H$_2$O and 18.45 g of sodium carbonate are introduced into a solution of 250 ml of 1,2-propanediol and 12.15 ml of water. The mixture is heated to boiling point (160° C.) with a rate of increase in temperature of 6° C.min$^{-1}$. The ferrite phase is formed via a chemical process involving the formation of an intermediate phase. Consequently, the mixture has to be refluxed for 5 hours in order to obtain the final product as a pure solid phase.

After cooling to ambient temperature, the particles are separated from the supernatant by centrifuging, washed with ethylene glycol and acetone, and then dried in air at 50° C. The dried nanoparticles are subsequently dispersed in DEG for one hour under ultrasound. The coating material, 1,2-propanediol, is thus exchanged with DEG. This dispersion of nanoparticles is subsequently used.

The continuation of the operations is the same as in example 1.

EXAMPLE 3

Van der Waals Interactions

Iron Oxide Nanoparticles Coated with Polymethyl Methacrylate/Electografted Layer of Polymethyl Methacrylate The substrate is identical to that of example 1.

Preparation of the Nanoparticles Coated with Poly(Methyl Methacrylate)

A mixture of Superhydride/THF and 50 ml of THF is added dropwise to a solution of FeCl$_2$ (7.1 mM) and poly(methyl methacrylate) (5% by weight) in tetrahydrofuran (THF) (50 ml). The mixture is left to react for one hour and then for an additional hour in the presence of air in order to provide for the oxidation of the nanoparticles. The nanoparticles, stabilized by PMMA, are precipitated from ethanol and redissolved in THF several times in order to remove the reaction by-products. The nanoparticles then form a suspension in THF.

Preparation of the Sample

No cleaning is carried out in order not to hydrogenate the silica. It thus remains hydrophilic.

Preparation of a Layer of p-MMA (Polymethyl Methacrylate) on the Silicon

A solution containing 10 mM of 4-nitrobenzenediazonium, 50% by volume of methyl methacrylate and 10 mM of sodium nitrate is prepared in DMF, in an electrochemical cell, such as that of example 1; 2 cycles are carried out between the open circuit potential and −2.8 V/SCE at a scan rate of 100 mV·s$^{-1}$. The structure is subsequently rinsed under ultrasound in DMF, then deionized water and dried. A layer of poly(methyl methacrylate) of approximately 20 nm is obtained.

Deposition of the Coated Nanoparticles on the Electrografted Polymer

The structure obtained is immersed in the solution of nanoparticles coated with p-MMA in THF; the nanoparticles are left to react for 10 minutes and then rinsing is carried out with THF, with DMF and, finally, with deionized water.

Annealing

Samples comprising nanoparticles in their via hole bottoms were subjected to an annealing under air at 450° C.

In this example, the same polymer coats the nanoparticles and covers the surface of the silicon. It is the interactions between the p-MMA chains on the nanoparticles and the electrografted layer which provide the specificity.

Furthermore, the hydrophobic —CH$_2$—C(CH$_3$) groups of the p-MMA are on the outside of the coating; they have no affinity for the hydrophilic surface of the silica.

EXAMPLE 4

Electrostatic Interactions

Nickel Oxide Nanoparticles Coated with Cetyltrimethylammonium bromide (CTAB)/Electrografted Layer of Poly(Acrylate) (p-acryCOO$^-$)

In this example, use is made of a silicon substrate identical to that of example 1.

Nickel or silver nanoparticles can be prepared by reduction of nickel salts by hydrazine hydrate in aqueous solution and in the presence of CTAB (cetyltrimethylammonium bromide); monodispersed nanoparticles (20 nm and 13 nm, respectively) of Ni/Ni(OH)$_2$ are obtained, which lose their CTAB layer at approximately 300° C. They were studied by various techniques: UV/visible, FTIR and NMR spectroscopy, TGA and small-angle X-ray diffraction. The presence of a bilayer of cetyltrimethylammonium on the surface of these nanoparticles is clearly shown: an image of this bilayer was obtained by molecular mechanical calculations, which reflects the spectroscopic measurements and shows polar-N$^+$ groups turned towards the solvent.

The same type of coating was demonstrated on copper nanoparticles, gold nanorods or gold nanoparticles prepared under the same conditions.

Preparation of the Nickel Oxide Nanoparticles Coated with Cetyltrimethylammonium Bromide The nickel nanoparticles are prepared. 1 g of CTAB ($3\times10^{-3}$ mol) is poured into 50 ml of water while gently heating until completely dissolved. 250 mg of NiSO$_4$ ($10^{-3}$ mol) are subsequently added to the mixture and 100 mg of NaBH$_4$ ($2.6\times10^{-3}$ mol) are quickly poured in. After reacting for 5 minutes, the samples can be immersed in this mixture of nanoparticles.

Preparation of the Sample

The surfaces are treated as in example 1 in order to convert the silica surface formed on the silicon to SiH.

Preparation of a Layer of Polyacrylate on the Silicon, Titanium or Aluminum

The standard experimental protocol is defined as follows: $20\times10^{-3}$ mol of monomer (acrylic acid) are dissolved in 50 ml of 1.2M HCl and then the solution is poured into an electrochemical cell and degassed with argon. After half an hour, $5\times10^{-4}$ mol of diazonium are dissolved in the solution. The substrate is then connected at the front face via a contact to the silver adhesive and placed in the cell opposite a contraelectrode made of carbon sheet. A reference saturated calomel electrode (SCE) is added. The potential is applied between the equilibrium potential of the solution on open circuit and $-2$ V/SCE at a scan rate of 100 mV·s$^{-1}$. Two scans are carried out in order to obtain a polymer layer thickness of approximately 15 nm. The sample is subsequently rinsed, using a wash bottle, with DMF, in order to remove the traces of ungrafted polymer, with acetone, in order to remove the DMF, and finally with a saturated bicarbonate solution, in order to neutralize the carboxylate (—COO$^-$) functional groups. After drying with argon, the sample is ready for the deposition of nanoparticles.

Deposition of the Coated Nanoparticles on the Electrografted Polymer

The structure, where the silicon was electrografted beforehand with neutralized acrylic acid, that is to say in the acrylate form, is immersed in the dispersion of nanoparticles at 110° C. (T$_g$ of polyacrylic acid). Nanoparticles well dispersed over the polymer with a thickness of approximately 12 nm are observed by electromicroscopy.

Annealing

As in Example 1.

In this example, the desired specificity of the grafting to the regions Z is provided essentially by the electrostatic interaction between the COO$^-$ carboxylate groups of the acrylic acid and the —N$^+$(CH$_3$)$_3$ ammonium groups of the CTAB on the outside of the CTAB double layer acting as coating, and the absence of interactions between the hydrogenated silica and the coating material.

Si—COO$^-$ $^+$N(CH$_3$)$_3$(CH$_2$)$_{15}$CH$_3$CH$_3$(CH$_2$)$_{15}$(CH$_3$)$_3$N$^+$ Niox NP

EXAMPLE 5

Electrostatic Interactions

Nickel Oxide Nanoparticles Coated with Cetyltrimethylammonium Bromide (CTAB)/Electrografted Layer of Poly(4-Carboxyphenylene)

The procedure is carried out as in example 4 but the polyacrylic acid is replaced with poly(4-carboxyphenylene) obtained by electrochemical reduction of the diazonium salt of 4-aminobenzoic acid.

Preparation of a Layer of Poly(4-Carboxyphenylene) on the Silicon or Titanium A 10 mM solution of 4-aminobenzoic acid in a hydrochloric acid solution at pH 2 is prepared, the solution is cooled to approximately 5° C. and a concentration of 11 mM of NaNO$_2$ is subsequently added. This solution is poured into an electrochemical cell similar to that of example 1 and the potential (chronoamperometry) is maintained for 300 s at $-0.5$ V/SCE in order to obtain a layer of approximately 20 nm. This layer is carefully rinsed under ultrasound in water and then acetone, and it is subsequently treated with a sodium carbonate solution in order to deprotonate the carboxyl groups. It is used like the acrylic acid layer of the preceding example.

The invention claimed is:

1. A process for the deposition of nanoparticles made of a conducting or semiconducting or insulating material on predetermined regions Z made of a conducting or semiconducting material of a substrate S, wherein the process comprises the following stages:
    a) creating, around the regions Z, regions I made of an insulating material, when these regions I are not already present,
    b) depositing, by electrografting, on the conducting or semiconducting material constituting the regions Z, a polymer P prepared from diazonium salt or from ammonium salt or from sulfonium salt or from iodonium salt or from alkyl halides or from vinyl monomers or from a mixture of these,
    c) coating the nanoparticles with a coating material comprising a bifunctional molecule capable of creating a bond with the nanoparticles and a bond with the polymer P,
    d) suspending the coated nanoparticles obtained in stage c) in a solvent
    e) immersing the substrate S obtained in stage b) in the suspension obtained in stage d), and
    f) removing the polymer P.

2. The process as claimed in claim 1, wherein the process additionally comprises, before stage b), a stage of removal of an oxide layer possibly formed on the surface of the regions Z.

3. The process as claimed in claim 1, wherein the nanoparticles are not oxidized at the surface and that it additionally comprises a stage of partial or complete oxidation of the surface of said nanoparticles, before the coating stage c).

4. The process as claimed in claim 1, wherein the nanoparticles are made of a material chosen from a metal and a metal oxide.

5. The process as claimed in claim 4, wherein the nanoparticles are made of a material chosen from nickel oxide, iron oxide, cobalt oxide and the mixtures and alloys of these.

6. The process as claimed in claim 1, wherein the substrate S is made of a material chosen from carbon, doped or undoped silicon, a silicide, preferably nickel, iron or cobalt silicide, a metal, preferably aluminum or titanium, titanium nitride (TiN) and tantalum nitride (TaN).

7. The process as claimed in claim 1, wherein the regions I are made of a material chosen from silica ($SiO_2$), alumina ($Al_2O_3$) and a phosphosilicate glass.

8. The process as claimed in claim 1, wherein the polymer P comprises ammonium, amine, alcohol, carboxylate, carboxyl, halide or thiol functional groups and the mixtures of these.

9. The process as claimed in claim 1, wherein the polymer P comprises a repeat unit of the aryl type having the following formula:

in which R is a $C_1$ to $C_{14}$ alkyl, or an alkyl chain partially or completely substituted by halogens, CN, OH, $NH_2$, $NO_2$ or COOH, or a $C_6$ aryl or a fused $C_{10}$ aryl, such as naphthalene, or a fused $C_{14}$ aryl, such as anthracene, or CN, OH, $NH_2$, $NO_2$ or COOH, or also a protein.

10. The process as claimed in claim 1, wherein the polymer P is a polyvinyl comprising units having the following formula:

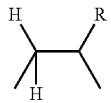

in which R is a $C_1$ to $C_{14}$ alkyl, or an alkyl chain partially or completely substituted by halogens, CN, OH, $NH_2$, $NO_2$ or COOH, or a $C_6$ aryl or a fused $C_{10}$ aryl, such as naphthalene, or a fused $C_{14}$ aryl, such as anthracene, or CN, OH, $NH_2$, $NO_2$ or COOH, or also a protein.

11. The process as claimed in claim 10, wherein the polymer P is a poly(acrylonitrile), poly(butenenitrile), poly(methacrylonitrile), poly(methacrylate), poly($C_1$ to $C_{14}$ hydroxyalkyl methacrylate), preferably poly(hydroxymethyl methacrylate) or poly(hydroxyethyl methacrylate), or polystyrene polymer.

12. The process as claimed in claim 1, wherein the material for coating nanoparticles is chosen from poly(hydroxymethyl methacrylate), diethylene glycol and cetyltrimethylammonium bromide.

13. The process as claimed in claim 1, wherein stage f) of removal of the polymer P is a stage of thermal decomposition of the polymer P.

14. The process as claimed in claim 1, wherein the regions Z are the bottoms of electrode vias.

15. A process for the manufacture of carbon nanotubes, wherein the process comprises a stage of deposition of nanoparticles made of a conducting, semiconducting or insulating material on predetermined regions Z of a substrate S according to the process as claimed in claim 1 and a stage of growth of the carbon nanotubes in the vapor phase starting from these nanoparticles.

16. A process for the manufacture of an electrode, wherein the process comprises a stage of deposition of nanoparticles made of a conducting, semiconducting or insulating material as claimed in claim 1 or a stage of manufacture of carbon nanotubes further comprising a stage of growth of the carbon nanotubes in the vapor phase starting from these nanoparticles.

17. The process as claimed in claim 10, wherein the polymer P is a poly(hydroxymethyl methacrylate) or poly(hydroxyethyl methacrylate).

18. The process as claimed in claim 1, wherein solvent in stage d) comprises of a solution of the coating material used in stage c).

* * * * *